United States Patent [19]

Kumagai et al.

[11] Patent Number: 5,302,845
[45] Date of Patent: Apr. 12, 1994

[54] TRANSISTOR WITH AN OFFSET GATE STRUCTURE

[75] Inventors: Jumpei Kumagai; Tomohisa Mizuno, both of Yokohama, Japan

[73] Assignee: Kabushiki Kaisha Toshiba, Kawasaki, Japan

[21] Appl. No.: 121,292

[22] Filed: Sep. 15, 1993

Related U.S. Application Data

[63] Continuation of Ser. No. 751,058, Aug. 28, 1991, abandoned.

[30] Foreign Application Priority Data

Aug. 29, 1990 [JP] Japan .................................. 2-229220
Aug. 19, 1991 [JP] Japan .................................. 3-206769

[51] Int. Cl.$^5$ ............................................ H01L 29/78
[52] U.S. Cl. ............................................ 257/327
[58] Field of Search ................ 357/23.4, 327, 328, 357/329

[56] References Cited

U.S. PATENT DOCUMENTS

| | | | |
|---|---|---|---|
| 4,994,869 | 2/1991 | Matloubian | 357/23.4 |
| 5,061,975 | 10/1991 | Inuishi et al. | 357/23.4 |
| 5,119,152 | 6/1992 | Mizuno | 357/23.3 |

OTHER PUBLICATIONS

T. Mizuno, et al., "High Dielectric LDD Spacer Technology for High Performance MOSFET Using Gate--Fringing Field Effects", IDEM Tech. Dig., p. 613 Jan. (1989).

"New Degradation Phenomena by Source and Drain Hot-Carriers in Half-Micron P-MOSFETS", by T. Mizuno, et. al., IDEM 86, Jan. 1986 IEEE, pp. 726-729.

*Primary Examiner*—John D. Lee
*Assistant Examiner*—Robert E. Wise
*Attorney, Agent, or Firm*—Finnegan, Henderson Farabow, Garrett & Dunner

[57] ABSTRACT

At the surface of a p-type silicon substrate, n-type source/drain diffused layers are formed. On the substrate between the source/drain diffused layers, a gate insulating film made of a silicon oxide film is formed so as to be isolated from the diffused layers. A gate electrode is formed on the gate insulating film. Sidewalls are formed on the sides of the gate insulating film and gate electrode, extending upward from the substrate. In this invention, the sidewalls are composed of material whose permittivity is higher than that of the gate insulating film, for example, of a silicon nitride film.

44 Claims, 12 Drawing Sheets

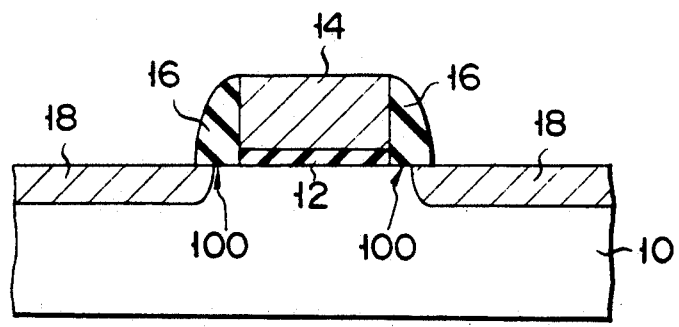
F I G. 1
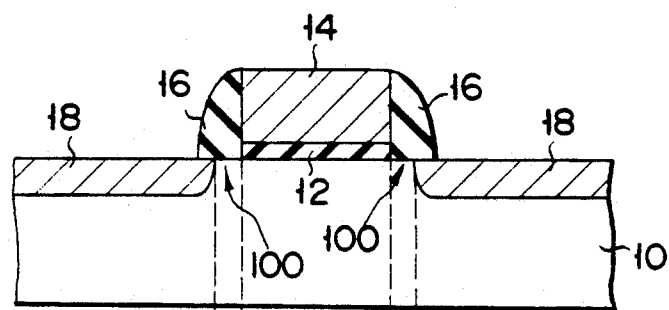
F I G. 2
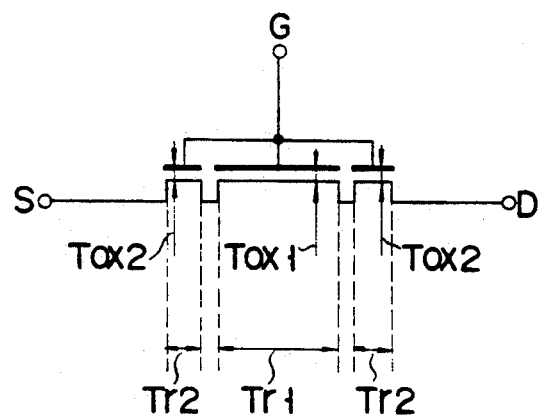
F I G. 3

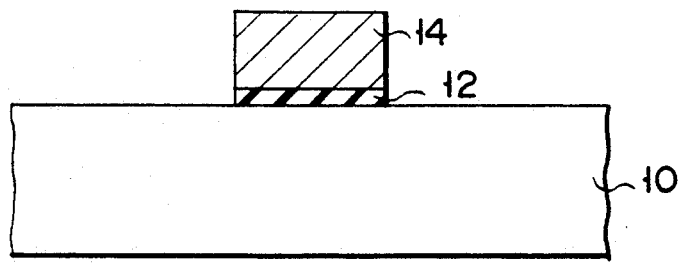
F I G. 4A
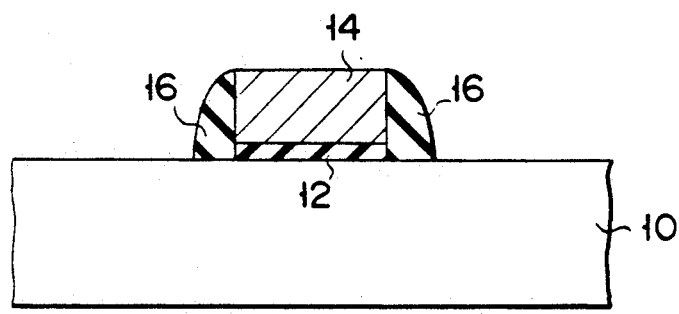
F I G. 4B
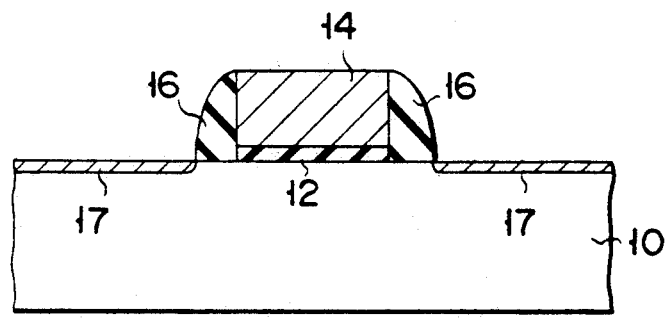
F I G. 4C
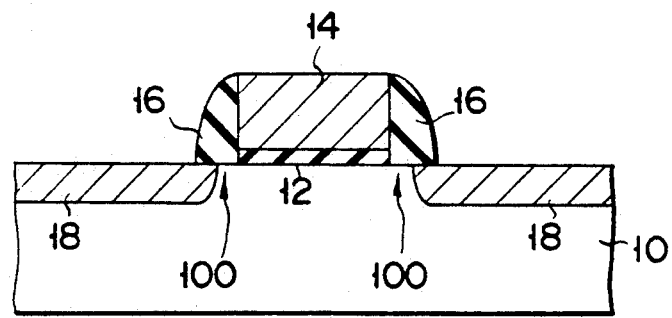
F I G. 4D

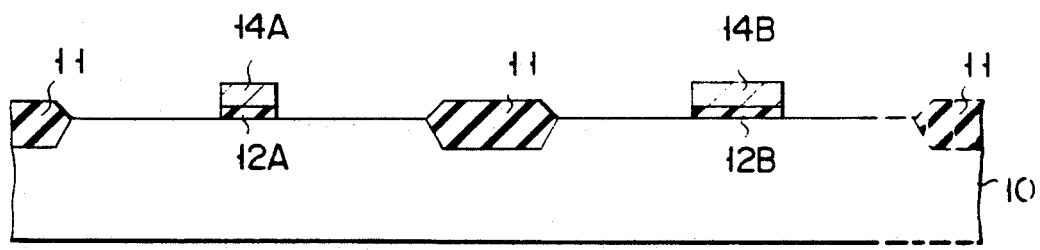
F I G. 5A
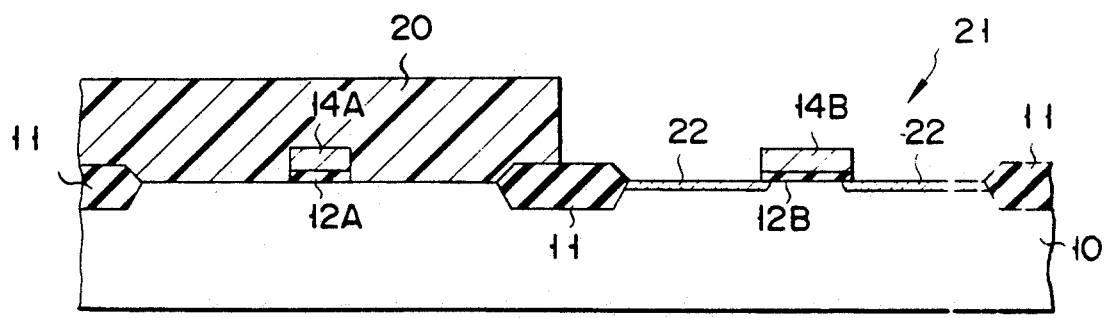
F I G. 5B
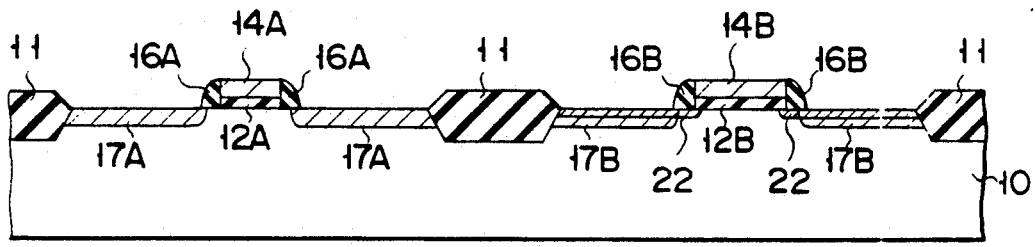
F I G. 5C
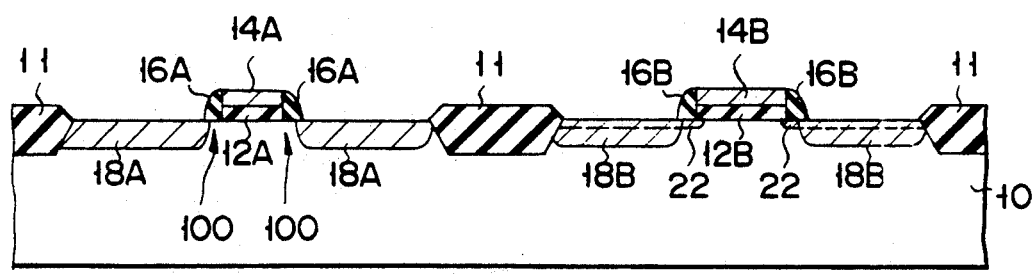
F I G. 5D

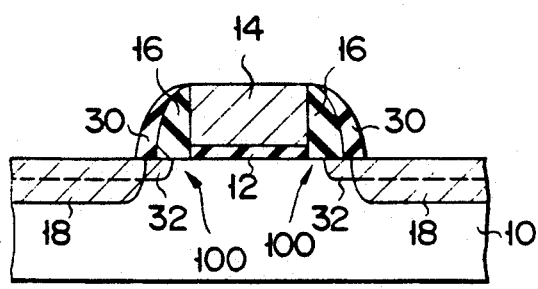
F I G. 6
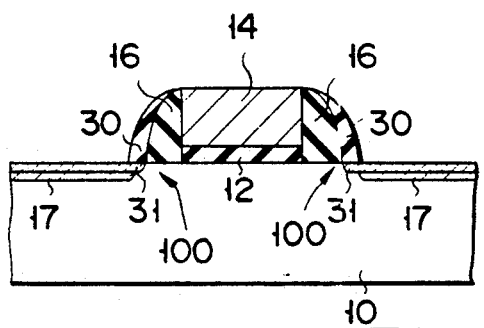
F I G. 7C
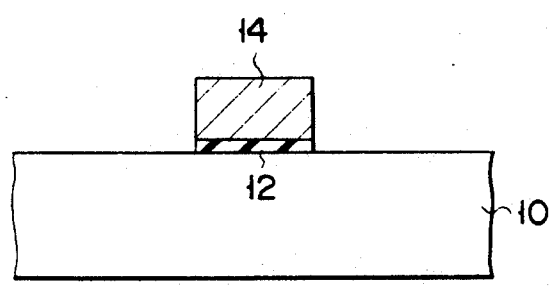
F I G. 7A
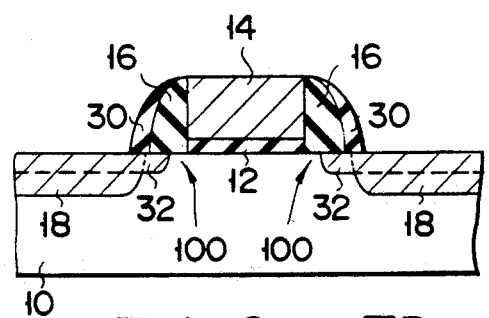
F I G. 7D
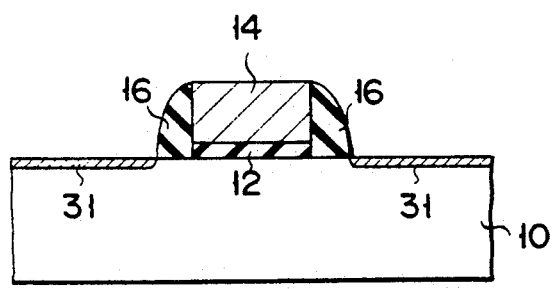
F I G. 7B

TRANSISTOR WITH AN OFFSET GATE STRUCTURE

This application is a continuation of application Ser. No. 07/751,058, filed Aug. 28, 1991, now abandoned.

BACKGROUND OF THE INVENTION

1. Field of the Invention

This invention relates to a transistor with an offset gate structure, and more particularly to an improvement in the driving capability of a transistor with an offset gate structure.

2. Description of the Related Art

In MOSFETs, as their channel length become shorter, a short channel effect begins to take place, resulting in a fluctuation in the threshold value. For a MOSFET structure to alleviate the short channel effect, an LDD (Lightly Doped Drain) structure is widely known which has a reduced impurity concentration in the source/drain diffused layers, particularly in the vicinity of the gate electrode.

In LDD MOSFETs, the low impurity concentration at the edges of the diffused layers particularly in the vicinity of the gate electrode reduces an electric field strength there, which alleviates a short channel effect, improving the withstand voltage.

Even with such LDD MOSFETs, as their component elements get smaller, the withstand voltage decreases. A reduction in the withstand voltage is particularly significant when the gate length is smaller than or on the order of 0.6 to 0.4 $\mu$m.

To solve this problem, an offset gate structure has been proposed which has a portion formed in the channel region at which the source/drain diffused layers and the gate electrode do not overlap each other.

These types of offset gate MOSFETs have an offset region in the current path (the channel region).

In the offset region, however, an inversion layer is not formed easily, thereby offering a high resistance. For this reason, offset gate MOSFETs cannot carry a sufficiently large current, which makes it difficult for the MOSFETs to sufficiently drive the transistors at the subsequent stage. That is, MOSFETs with an offset gate structure have a poor driving capability.

SUMMARY OF THE INVENTION

In accordance with the present invention, an offset gate MOSFET is provided which solves the poor driving problem that conventional offset gate MOSFETs have and which offers a high driving capability.

The foregoing object is accomplished by the present invention in which the sidewalls formed on the sides of the gate electrode are composed of an insulator whose permittivity is higher than that of the gate insulating film. This arrangement allows the potential of the gate electrode to be effectively applied to the offset region formed in the substrate under the sidewalls, enabling the offset region to be sufficiently inverted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view for an offset gate MOSFET according to a first embodiment of the present invention;

FIG. 2 is a view for explaining how an electric field is applied to the MOSFET of the first embodiment of the present invention;

FIG. 3 is an equivalent circuit for the MOSFET of the first embodiment;

FIG. 4A through 4D are sectional views illustrating the manufacturing sequence of the MOSFET of the first embodiment;

FIGS. 5A through 5D are sectional views illustrating the manufacturing sequence of a semiconductor device where an offset gate MOSFET and an LDD MOSFET are formed on the same substrate;

FIG. 6 is a sectional view for a MOSFET according to a second embodiment of the present invention;

FIGS. 7A through 7B are sectional views showing the manufacturing sequence of the MOSFET according to the second embodiment;

DETAILED DESCRIPTION OF THE PREFERRED EMBODIMENTS

Figure 8:
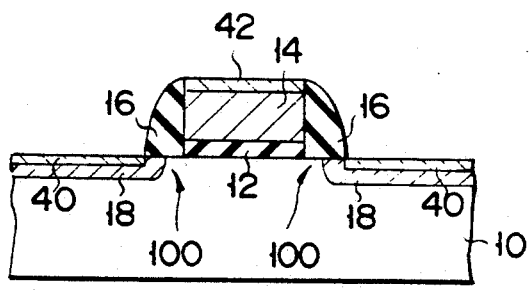
FIG. 8 is a sectional view for a MOSFET according to a third embodiment of the present invention.

Referring to the accompanying drawings, embodiments of the present invention will be explained. Like parts throughout the drawings ar indicated by like reference characters and the repetition of the same explanations will be avoided.

FIG. 1 is a sectional view for a MOSFET with an offset gate structure according to a first embodiment of the present invention.

As shown in FIG. 1, on a substrate such as a p-type silicon substrate 10, a gate insulating film 12 is formed which is made up of, for example, a silicon oxide film. Formed on the gate insulating film 12 is a gate electrode 14 composed of, for example, a polysilicon film, on the sides of which sidewalls 16 are formed which are made up of high dielectric material, such as a silicon nitride film. In the substrate 10, n-type source/drain diffused layers (electrode regions) 18 are formed so as to produce offset regions 100.

FIG. 2 is a view showing how an electric field is applied to the substrate 10 between the n-type source/drain diffused layers 18 of the MOSFET of the first embodiment. FIG. 3 is an equivalent circuit for the MOSFET.

The ordinate in FIG. 2 indicates the strength of the electric field $\epsilon x$ perpendicular to the substrate 10.

As shown in FIG. 2, in offset gate MOSFETs according to the present invention, the sidewalls 16 composed of an insulator whose permittivity is higher than that of the insulator making up the gate insulating film 12 make the electric field applied to the substrate under the sidewalls 16 stronger than that applied to the substrate below the gate electrode 14. This causes the offset regions 100 to be inverted sufficiently. Therefore, even with offset regions above the current path of the MOSFET, the present invention allows sufficient current to flow, preventing the driving capability to decrease.

FIG. 3 shows an equivalent circuit for the offset-gate MOSFET of this invention. Tr1 indicates a transistor with the gate insulating film 12, Tr2 a parasitic transistor with the sidewalls 16 as gate insulating films. $T_{OX}1$ represents the thickness of Tr1 gate insulating film and $T_{OX}2$ an apparent thickness of Tr2 gate insulating film.

According to this invention, the apparent gate insulating film thickness $T_{OX}2$ can be set to a value equal or less than $T_{OX}1$. As a result, an electric field can be intensified particularly in the offset regions.

The manufacturing method of the MOSFET of the first embodiment will be explained, referring to FIGS. 4A through 4D.

FIGS. 4A through 4D are sectional views illustrating the manufacturing sequence of the MOSFET of the first embodiment.

As shown in FIG. 4A, for example, a silicon oxide film to serve as the gate insulating film 12 is first formed on the p-type silicon substrate 10 by thermal oxidation. On the resultant structure, a polysilicon film to serve as a gate electrode is formed by CVD (Chemical Vapor Deposition). Then, using, for example, photoetching techniques, the polysilicon film and silicon oxide film are etched in sequence to obtain the gate insulating film 12 and gate electrode 14.

Next, as shown in FIG. 4B, on the resultant structure, for example, silicon nitride films to serve as the sidewalls 16 are formed by CVD, followed by the etching of the silicon nitride film by, for example, anisotropic etching such as RIE (Reactive Ion Etching). This leaves the silicon nitride film on the sides of the gate electrode 14 to produce the sidewalls 16.

As shown in FIG. 4C, using the gate electrode 14 and sidewalls 16 as a mask, n-type impurity ions such as P ions or As ions are then implanted into the substrate 10. The regions into which ions have been implanted are indicated by numeral 17.

Next, as shown in FIG. 4D, using a suitable treatment such as heat treatment, the implanted impurity ions are activated to produce the source/drain diffused layers 18.

The MOSFET according to the first embodiment has now been completed.

Another type of semiconductor device will be explained in which an offset gate MOSFET of the present invention and an LDD MOSFET are formed on the same substrate.

FIGS. 5A through 5D are sectional views illustrating the manufacturing sequence of a semiconductor device in which a MOSFET having an offset gate structure of the present invention and a MOSFET having an LDD structure are formed on the same substrate.

As shown in FIG. 5A, on the surface of the p-type silicon substrate 10 having a surface concentration of $5 \times 10^{16}$ cm$^{-3}$ or higher, element isolating regions 11 are formed by, for example, LOCOS (LOCalized Oxidation of Silicon). On the surfaces of the isolated element regions, for example, silicon oxide films having a thickness of 160 Å or smaller, to serve as gate insulating films 12A and 12B are formed by thermal oxidation. On the resultant structure, polysilicon films to serve as gate electrodes 14A and 14B are formed by, for example, CVD. Then, using, for example, photoetching techniques, the polysilicon films and silicon oxide films are etched in sequence to obtain the gate insulating films 12A and 12B and gate electrodes 14A and 14B.

Next, as shown in FIG. 5B, photoresist is applied onto the resultant structure. A window 21 is then made in the photoresist 20 to expose the planned LDD MOS transistor region by photoetching. With the photoresist 20 and gate electrode 14B as a mask, n-type impurity ions, such as P ions or As ions, are implanted into the substrate 10 (dose $3 \times 10^{13}$ cm$^{-2}$ or larger). The regions into which ions have been implanted are indicated by numeral 22.

As shown in FIG. 5C, the photoresist 20 is then removed from the substrate 10. On the resultant structure, for example, silicon nitride films to serve as sidewalls 16A and 16B are formed by CVD, followed by the etching of the silicon nitride films by anisotropic etching such as RIE. This leaves silicon nitride films on the sides of the gate electrodes 14A and 14B to produce sidewalls 16A and 16B. Gate electrodes 14A and 14B as a mask, P ions or As ions are implanted into the substrate 10 (dose $5 \times 10^{15}$ cm$^{-2}$ or larger). The regions into which ions have been implanted are indicated by numeral 17A and 17B.

Next, as shown in FIG. 5D, by a suitable treatment such as heat treatment, the implanted impurity ions are activated to form source/drain diffused layers 18A and 18B.

Now, a semiconductor device has been completed in which an offset-gate MOSFET and an LDD MOSFET are formed on the same substrate.

As noted above, MOSFETs having an offset gate structure according to the present invention can be formed together with MOSFETs having an LDD structure on a single substrate. To produce such a composite structure only requires an additional process of FIG. 5B. Since this process can also serve as the process of masking the opposite-conductivity type transistor for semiconductor devices with CMOS integrated circuits, the application of offset-gate transistors of the present invention to CMOS semiconductor devices involves no increase in the number of manufacturing processes compared with the preceding embodiment.

In the semiconductor device constructed as described above, to make use of the characteristics and features of the two different types of transistors, it is desirable to use them in the manner described below, for example.

For places requiring microstructures, for example, offset-gate MOSFETs of the present invention should be used. In the case of semiconductor memory devices, for example, memory cells require microstructures.

For places requiring high driving power transistors, but not microstructures, LDD MOSFETs should be used. In the case of semiconductor memory devices, there are circuits requiring high driving power to control the peripheral devices.

For places requiring high withstand voltage transistors, MOSFETs with an offset gate structure of the present invention should be used. In semiconductor memory devices, for example, input and output buffers require high withstand voltage transistors.

A MOSFET according to a second embodiment of the present invention will now be explained, referring to FIG. 6 and FIGS. 7A through 7B.

FIG. 6 is a sectional view for a MOSFET of the second embodiment.

As shown in FIG. 6, the MOSFET of the second embodiment has second sidewalls 30 on the sides of the sidewalls 16. It also has LDD regions 32 adjacent to the offset regions 100.

With the MOSFET of this arrangement, the withstand voltage increases compared with MOSFETs having the off-set regions 100 only. As with the first embodiment, making the sidewalls 16 out of an insulator whose permittivity is higher than that of the gate insulating film 12 prevents a decrease in the driving capability.

FIGS. 7A through 7D illustrate the manufacturing sequence of the MOSFET according to the second embodiment.

As shown in FIG. 7A, on the p-type silicon substrate 10 having the surface concentration of $5 \times 10^{16}$ cm$^{-3}$ or higher, the gate insulating film 12 having a thickness of 160 Å or smaller, and gate electrode 14 made of polysilicon films are first formed in the same manner as the process in FIG. 4A.

Then, as shown in FIG. 7B, the sidewalls 16 made of a silicon nitride film are formed on the sides of the gate electrode 14 in the same manner as the process in FIG. 4B. After this, with the gate electrode 14 and sidewalls 16 as a mask, n-type impurity ions such as P ions or As ions are implanted into the substrate 10 (dose $3 \times 10^{13}$ cm$^{-2}$ or gleater). The regions into which ions have been implanted are indicated by numeral 31.

As shown in FIG. 7C, on the resultant structure, second sidewalls 30 made of, for example, silicon nitride films are formed by CVD. Then, the silicon nitride film is etched by anisotropic etching such as RIE to leave the silicon nitride films on the sides of the sidewalls 16 as the second side walls 30. With the gate electrode 14 and second sidewalls 30 as a mask, n-type impurity ions such as P ions or As ions are implanted into the substrate 10 (dose $5 \times 10^{15}$ cm$^{-2}$ or gleater). At this time, to form an LDD structure, the dose level is raised higher than the dose level at which the ion implantation has been performed in the step in FIG. 7B. The regions into which ions have been implanted are indicated by numeral 17.

Next, as shown in FIG. 7D, by a suitable treatment such as heat treatment, the implanted ions are activated to produce the source/drain diffused layers 18 and LDD regions 32.

Now, the MOSFET of the second embodiment has been completed.

Although it is desirable to make the second sidewalls 30 out of high dielectric material such as a silicon nitride film as described above, other suitable materials may be used if at least the sidewalls 16 are made of high dielectric material, since the offset regions 100 are formed in the substrate 10 under the sidewalls 16.

A MOSFET according to a third embodiment of the present invention will now be explained, referring to FIG. 8 and FIGS. 9A through 9E.

FIG. 8 is a sectional view for a MOSFET according to the third embodiment.

As shown in FIG. 8, the MOSFET of the third embodiment has low-resistance n-type silicide regions 40 formed in the source/drain regions 18, by salicidation (self-alignment silicifying). At the surface regions of the source/drain diffused regions 18, the silicide regions 40 are formed in self-alignment with respect to the diffused regions 18. At the surface of the exposed gate electrode 14, a silicide region 42 is also formed.

In the MOSFET of the third embodiment, the low-resistance n-type silicide regions 40 are enclosed by the low-impurity concentration source/drain diffused layers 18, so that the withstand voltage is higher than that of the MOSFET of the first embodiment.

As with the first embodiment, above the offset regions 100, the sidewalls 16 are made up of an insulator whose permittivity is higher than that of the gate insulating film 12, which prevents a decrease in the driving capability.

FIGS. 9A through 9E illustrate the manufacturing sequence of the MOSFET of the third embodiment.

Figure 9A:
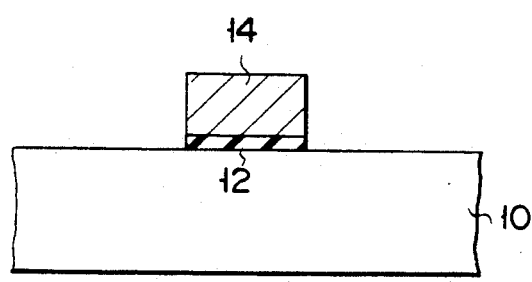
FIGS. 9A through 9E are sectional views showing the manufacturing sequence the MOSFET according to the third embodiment.

As shown in FIG. 9A, on the p-type silicon substrate 10, the gate insulating film 12 and gate electrode 14 made of polysilicon films are first formed in the same manner as the process in FIG. 4A.

Figure 9B:
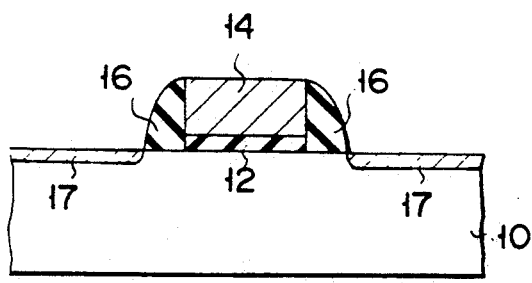

Then, as shown in FIG. 9B, the sidewalls 16 made of a silicon nitride film are formed in the same manner as the process in FIG. 4B. After this, with the gate electrode 14 and sidewalls 16 as a mask, n-type impurity ions such as P ions or As ions are implanted into the substrate 10. The regions into which ions have been implanted are indicated by numeral 17.

Figure 9C:
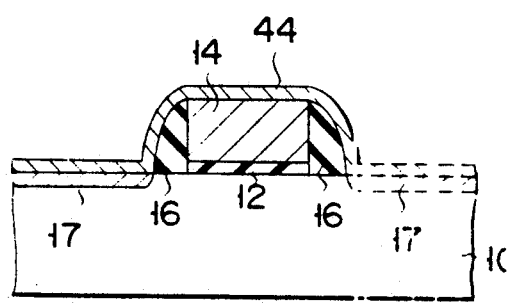

As shown in FIG. 9C, on the resultant structure, a high melting-point metal film such as a tungsten film 44 is formed by sputtering.

Figure 9D:
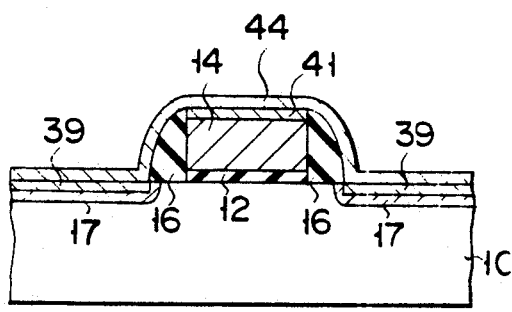

Then, as shown in FIG. 9D, a suitable treatment such as heat treatment causes tungsten atoms to move from the tungsten film 44 into the silicon. The regions containing tungsten atoms are indicated by numerals 39 and 41.

Figure 9E:
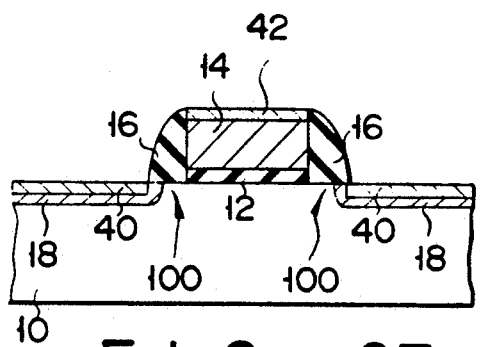

Next, as shown in FIG. 9E, by additional heat treatment following the step of FIG. 9D or after removal of the tungsten film 44, the silicon regions 39 and 41 containing tungsten atoms are turned into silicide to produce the silicide regions 40 and 42. At the same time, the implanted impurity ions are activated to form the source/drain diffused layers 18.

Now, the MOSFET of the third embodiment has been completed.

A MOSFET according to a fourth embodiment of the present invention will now be explained, referring to FIG. 10 and FIGS. 11A through 11D.

Figure 10:
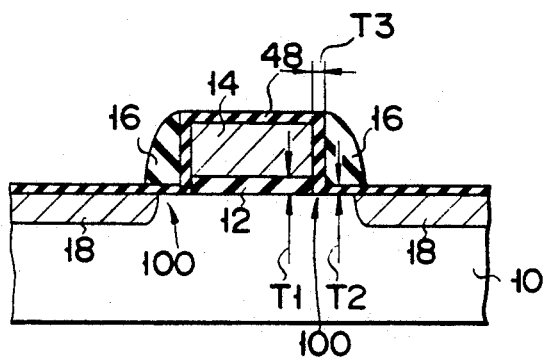
FIG. 10 is a sectional view for a MOSFET according to a fourth embodiment of the present invention.

FIG. 10 is a sectional view for a MOSFET of the fourth embodiment.

As shown in FIG. 10, on the sides of the gate electrode 14, an insulating film 48 is formed. The insulating film 48 is also formed on the surface of the substrate 10. The sidewalls 16 are formed on the insulating film 48. With this configuration, the relationship between the film thickness of the insulating film 48 and that of the gate insulating film 12 that meets the following expressions causes the offset regions 100 to be inverted sufficiently like the first to third embodiments. If the permittivity of the gate insulating film 12 is $\epsilon 1$, its thickness T1, the permittivity of the gate insulating film 48 $\epsilon 2$, its thickness on the substrate T2, and its thickness on the side of the gate T3, the expressions for sufficient inversion are:

$$T1/\epsilon 1 \geq (T2+T3)/\epsilon 2$$

$$T1/(T2+T3) \geq \epsilon 1/\epsilon 2 \quad (1)$$

For practical insulators for the gate insulating film 12 and insulating film 48, these expressions are calculated as follows: when both the gate insulating film 12 and the insulating film 48 are made of a silicon oxide film, if the permittivity of the silicon oxide film is 3.9, the expressions are:

$$T1/3.9 \geq (T2+T3)/3.9$$

$$T1 \geq T2+T3 \quad (2)$$

When the gate insulating film 12 is made of a silicon oxide film and the insulating film 48 is made of a silicon nitride film, if the permittivity of the silicon oxide film is 3.9 and that of the silicon nitride film 7.8, the expressions are:

$$T1/3.9 \geq (T2+T3)/7.8$$

$$2 \cdot T1+ \geq T2+T3 \quad (3)$$

In this embodiment, the gate insulating film 12 was composed of a 100 Å-thick silicon oxide film and the insulating film 48 was made of a 40 Å-thick silicon oxide film. The sidewalls 16 were made of silicon nitride films.

FIGS. 11A through 11D are sectional views illustrating the manufacturing sequence of the MOSFET of the fourth embodiment.

Figure 11A:
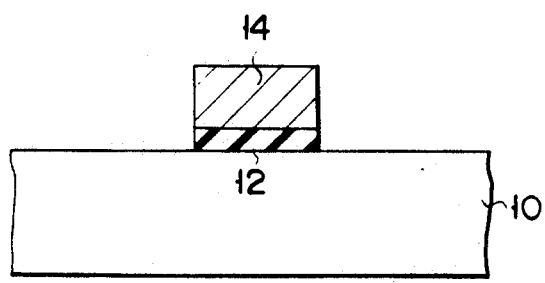
FIGS. 11A through 11D are sectional views illustrating the manufacturing sequence of the MOSFET according to the fourth embodiment.

As shown in FIG. 11A, on the p-type silicon substrate 10, the gate insulating film 12 made of a 100 Å-thick silicon oxide film and the gate electrode 14 made of polysilicon are first formed in the same manner as the process in FIG. 4A.

Figure 11B:
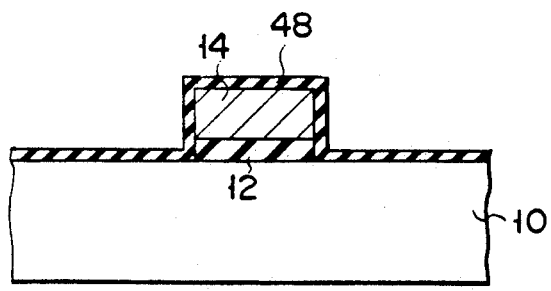

Then, as shown in FIG. 11B, the surfaces of the substrate 10 and gate electrode 14 undergo thermal oxidation to produce a 40 Å-thick oxide film 48.

Figure 11C:
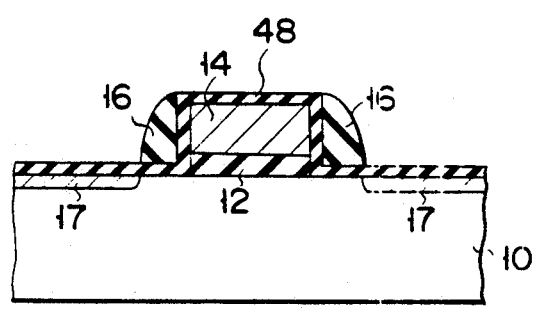

Next, as shown in FIG. 11C, on the sides of the gate electrode 14, the sidewalls 16 made of silicon nitride films are formed in the same manner as the process of FIG. 4B. After this, with the gate electrode 14 and sidewalls 16 as a mask, n-type impurity ions such as P or As ions are implanted into the substrate 10.

Figure 11D:
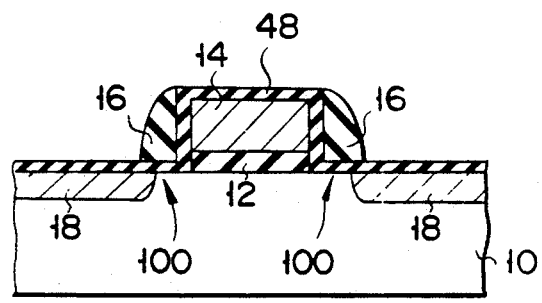

Then, as shown in FIG. 11D, the impurities are activated to form the source/drain diffused regions 18.

Now, the MOSFET of the fourth embodiment has been completed.

Referring to FIG. 12 and FIGS. 13A through 13E, a MOSFET according to a fifth embodiment of the present invention will now be explained.

Figure 12:
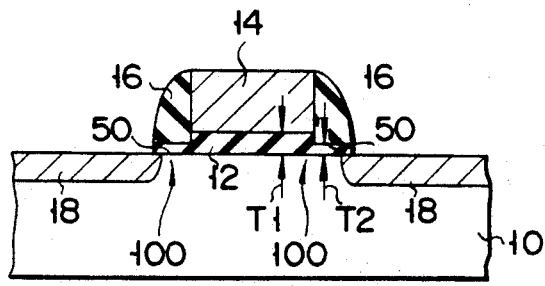
FIG. 12 is a sectional view for a MOSFET according to a fifth embodiment of the present invention.

FIG. 12 is a sectional view of a MOSFET according to the fifth embodiment.

As shown in FIG. 12, insulating films 50 made of, for example, the same material as that of the gate insulating film 12 may remain directly under the sidewalls 16. In this case, however, if the thickness T2 of the insulating film 50 is not thinner than the thickness T1 of the gate insulating film 12, an electric field applied to the offset regions 100 by the gate electrode 14 is not intensified.

FIGS. 13A through 13E are sectional views illustrating the manufacturing sequence of the MOSFET of the fifth embodiment.

Figure 13A:
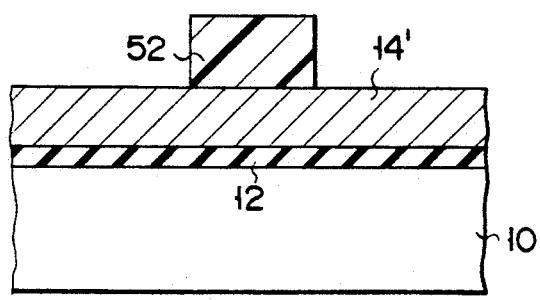
FIGS. 13A through 13B are sectional views illustrating the manufacturing sequence of the MOSFET according to the fifth embodiment.

First, as shown in FIG. 13A, on the p-type silicon substrate 10, the silicon oxide film 12 to serve as a gate insulating film is formed. On the silicon oxide film 12, polysilicon is then deposited by CVD to form a polysilicon layer 14', followed by the formation of a photoresist pattern 52 on the polysilicon layer 14'.

Figure 13B:
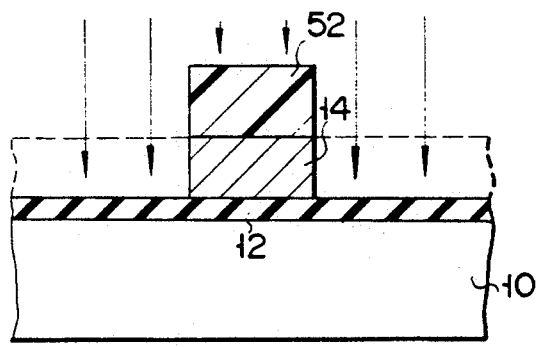

Then, as shown in FIG. 13B, with the photoresist pattern 52 as a mask, the polysilicon layer 14' is etched by RIE using $CF_4$ gas, to produce the gate electrode 14.

Figure 13C:
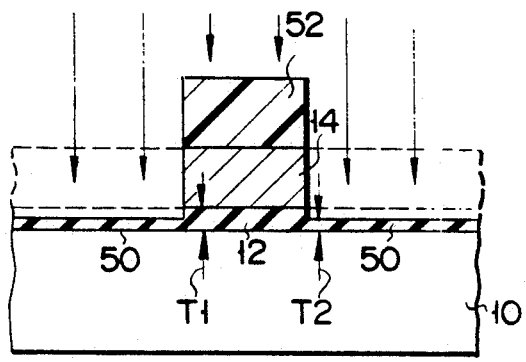

Next, as shown in FIG. 13C, further etching is performed by RIE to etch the silicon oxide film 12. This produces the silicon oxide film 50 whose thickness T2 is thinner than the thickness T1 of the silicon oxide film 12 under the gate electrode 14.

Figure 13D:
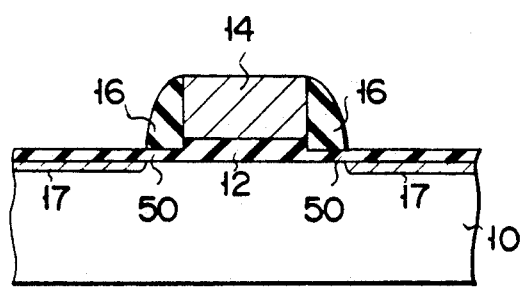

Following this, as shown in FIG. 13D, on the sides of the gate electrode 14, the sidewalls of silicon nitride films are formed in the same manner as the process of FIG. 4B. With the gate electrode 14 and sidewalls 16 as a mask, n-type impurity ions such as P or As ions are implanted into the substrate 10.

Figure 13E:
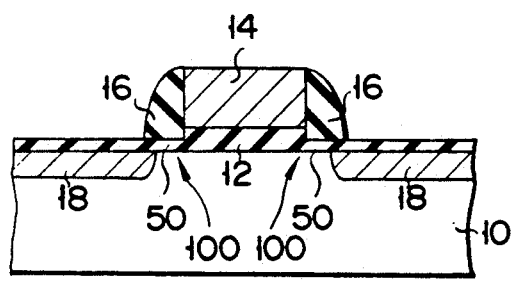

Then, as shown in FIG. 13E, the impurities are activated to form the source/drain diffused layers 18.

Now, the MOSFET of the fifth embodiment has been completed.

While in the above embodiment, the same etching gas is used for the RIE of FIG. 13B and that of FIG. 13C, different etching gases may be used in the etching of FIGS. 13B and 13C. In the step shown in FIG. 13B, $CF_4$ gas is used to perform RIE. In the step shown in FIG. 13C, $CH_3$ gas is may be used to perform RIE.

A MOSFET according to a sixth embodiment of the present invention will now be explained, referring to FIGS. 14A and 14B and FIGS. 15A through 15E.

Figure 14A:
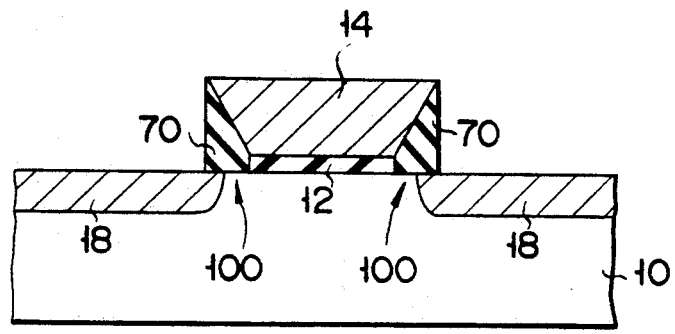
FIG. 14A is a sectional view for a MOSFET according to a sixth embodiment of the present invention.
Figure 14B:
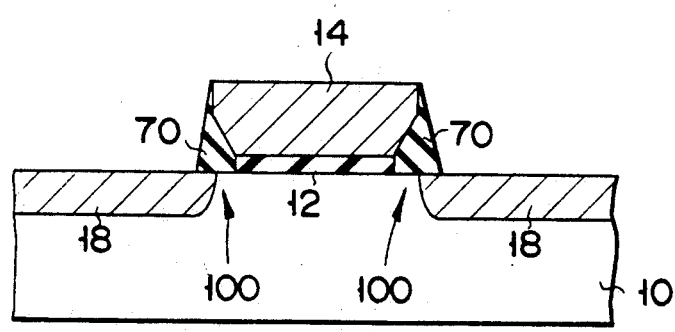
FIG. 14B is a sectional view for another MOSFET according to the sixth embodiment.

FIG. 14A is a sectional view for a MOSFET according to the sixth embodiment, and FIG. 14B is a sectional view for another MOSFET of the sixth embodiment.

As shown in FIGS. 14A and 14B, in the MOSFETs of the sixth embodiment, the gate electrode 14 has its sides tapered and on the tapered sides, sidewalls 70 are formed which are composed of an insulating film whose permittivity is higher than that of the gate insulating film 12.

FIGS. 15A through 15E are sectional views illustrating the manufacturing sequence of the MOSFET of the sixth embodiment.

Figure 15A:
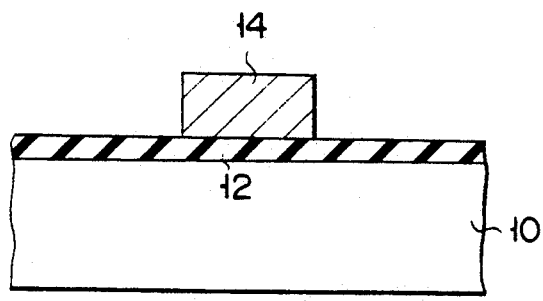
FIGS. 15A through 15E are sectional views showing the manufacturing sequence of the MOSFET according to the sixth embodiment.

As shown in FIG. 15A, on the p-type silicon substrate 10, the silicon oxide film 12 to serve as a gate insulating film is first formed. On the silicon oxide film, the gate electrode 14 is formed in the same manner as the process of FIG. 13B.

Figure 15B:
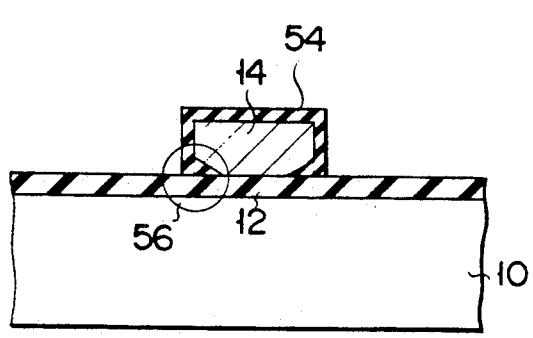
Figure 15C:
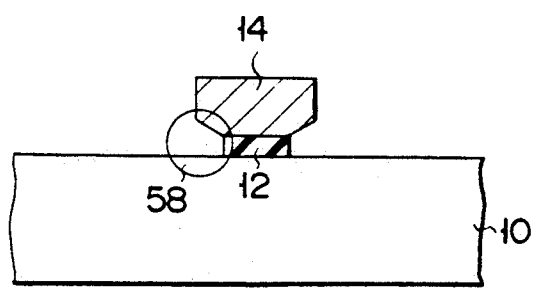
Figure 15D:
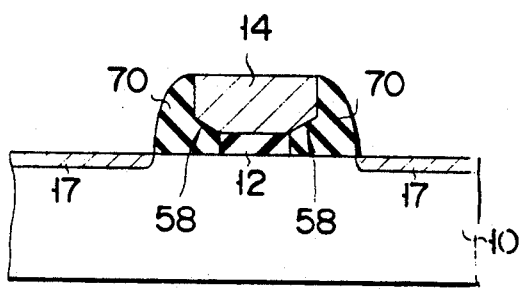

Then, as shown in FIG. 15B, the surface of the gate electrode undergoes thermal oxidation to form an oxide film 54. As this time, oxidation advances along the interface between the gate electrode 14 and the silicon oxide film 12, so that bird's beak-like portions 56, shown in the circle 56, develop in the oxide film 54.

Next, as shown in FIG. 5C, with the gate electrode 14 as a mask, the silicon oxide films 12 and 54 are etched. At this time, the gate electrode 14 has overhung portions formed on the silicon oxide film 12 as shown in the circle 58.

As shown in 15D, a silicon nitride film is then deposited on the resultant structure by LPCVD, which fills up the clearances between the gate electrode 14 and substrate 10 with the nitride film. Then, the nitride film is etched by RIE to produce sidewalls 70. After this, with the gate electrode 14 and sidewalls 70 as a mask, n-type impurity ions such as P or As ions are implanted into the substrate 10.

Figure 15E:
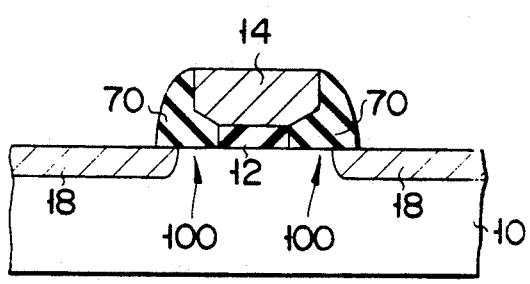

Next, as shown in FIG. 15E, the ions are activated to form the source/drain diffused layers 18.

Now, the MOSFET of the sixth embodiment has been completed. As in the fourth embodiment, a thin insulating film e.g., oxide film, can be formed on the silicon substrate 10 and gate electrode 14, and then the sidewalls 70 can be formed on the thin insulating film.

A MOSFET according to a seventh embodiment of the present invention will now be explained, referring to FIGS. 16 through 21.

Figure 16:
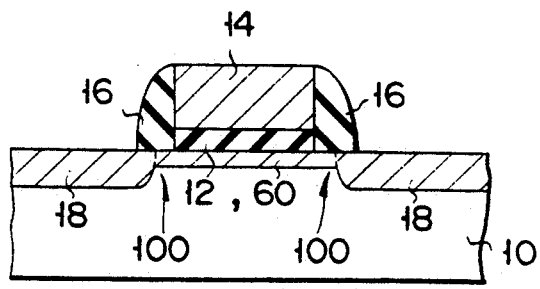
FIG. 16 is a sectional view for a MOSFET according to a seventh embodiment of the present invention.

FIG. 16 is a sectional view for a MOSFET according to the seventh embodiment.

As shown in FIG. 16, the MOSFET of the seventh embodiment is a buried channel MOSFET, in which the n-type source/drain diffused layers 18 are connected to each other with a diffused layer 60 whose conductivity type is the same as those of the diffused layers 18.

FIGS. 17 through 21 are sectional views for other MOSFETs according to the seventh embodiment.

Figure 17:
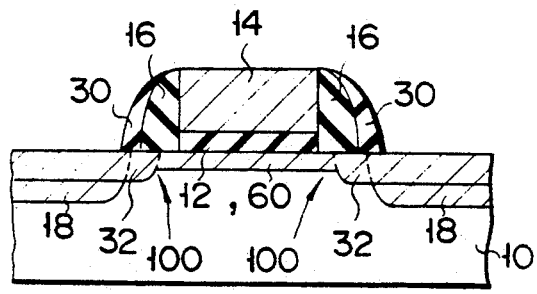

FIG. 17 is a sectional view for a buried channel type of the MOSFET described in the second embodiment.

Figure 19:
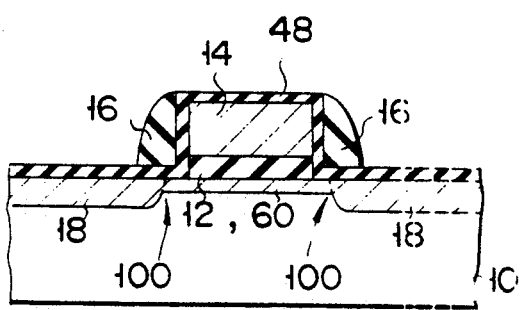
FIGS. 17 through 21 are sectional views for other MOSFETs according to the seventh embodiment.
Figure 20:
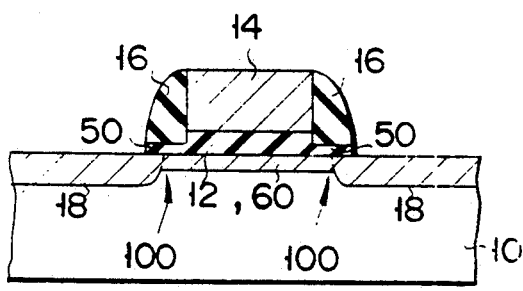
Figure 18:
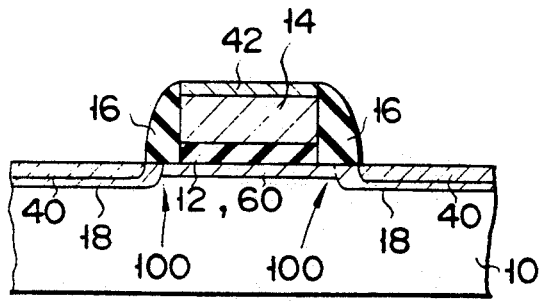
Figure 21:
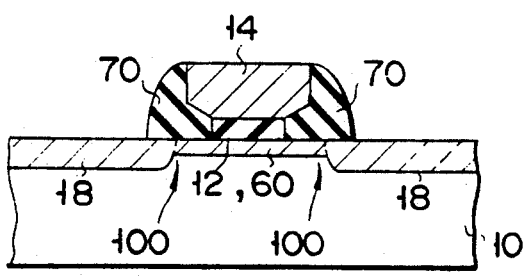

Similarly, FIG. 18 is a sectional view for a buried channel type of the MOSFET described in the third embodiment; FIG. 19 is a sectional view for a buried channel type of the MOSFET described in the fourth embodiment; FIG. 20 is a sectional view for a buried channel type of the MOSFET described in the fifth embodiment; and FIG. 21 is a sectional view for a buried channel type of the MOSFET described in the sixth embodiment.

In the MOSFETs constructed as shown in FIGS. 16 through 21, a decrease in the driving capability can be suppressed by forming the sidewalls 16 and 70 with an insulator whose permittivity is higher than that of the gate insulating film 12.

A MOSFET according to an eighth embodiment of the present invention will now be explained, referring to FIGS. 22 through 27.

Figure 22:
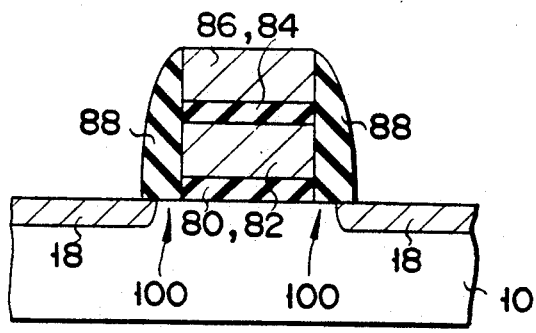
FIG. 22 is a sectional view for a MOSFET according to a eighth embodiment of the present invention.

FIG. 22 is a sectional view for a MOSFET according to the eighth embodiment.

As shown in FIG. 22, the MOSFET of the eighth embodiment is an application of the present invention to stacked gate MOSFETs, which are used for non-volatile memory cell transistors such as EPROMs or EEPROMs. Specifically, on the substrate 10 between the n-type source/drain diffused layers 18, a first gate insulating film 80 is formed. On the first gate insulating film 80 formed is a floating gate 82, on which a second gate insulating film 84 is formed. On the second gate insulating film, a control gate 86 are formed. Sidewalls 88, composed of an insulator whose permittivity is higher than of the first gate insulating film 80, are formed on and along the sides of the control gate 86, second gate insulating film 84, floating gate 82 and first gate insulating film 80 in that order, until the substrate 10 is reached. Offset regions 100 are formed in the substrate 10 directly under the sidewalls 88.

FIGS. 23 through 27 are sectional views for other MOSFETs of the eighth embodiment.

Figure 23:
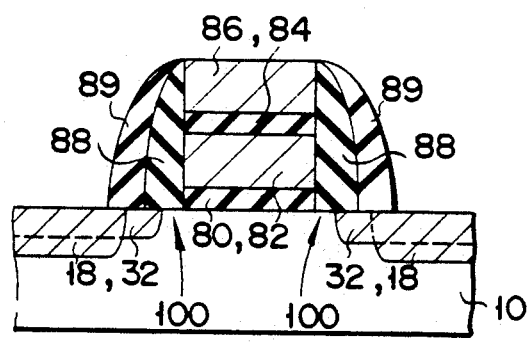

FIG. 23 is a sectional view for a stacked gate type of the MOSFET described in the second embodiment.

Figure 25:
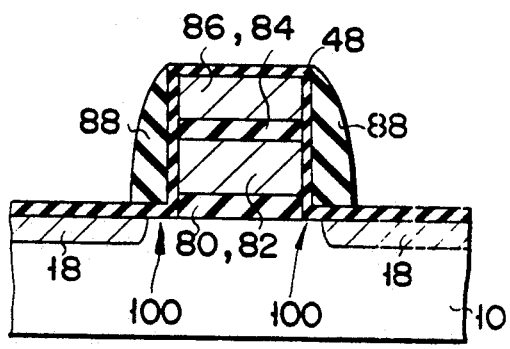
FIGS. 23 through 27 are sectional views for other MOSFETs according to the eight embodiment.
Figure 26:
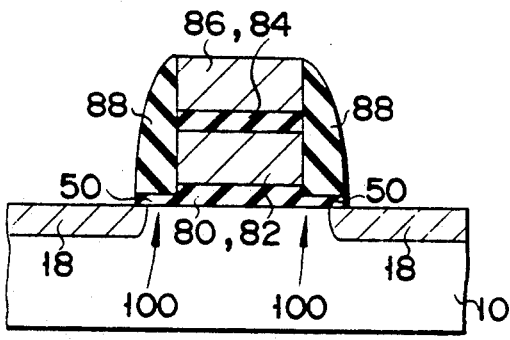
Figure 24:
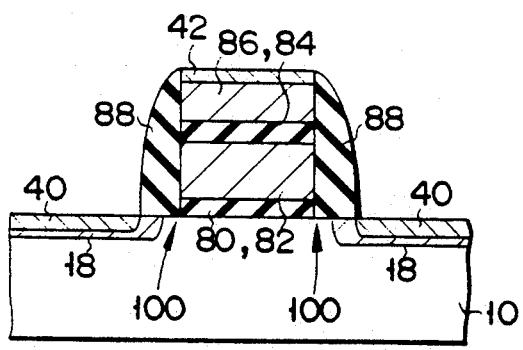
Figure 27:
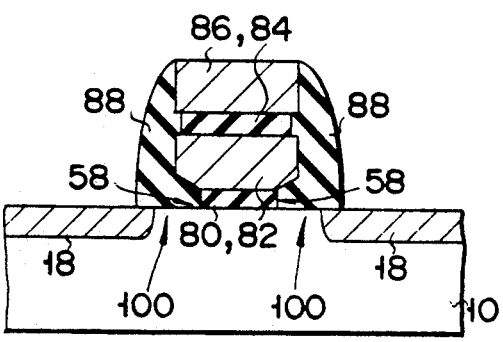

Similarly, FIG. 24 is a sectional view for a stacked gate type of the MOSFET described in the third embodiment; FIG. 25 is a sectional view for a stacked gate type of the MOSFET described in the fourth embodiment; FIG. 26 is a sectional view for a stacked gate type of the MOSFET described in the fifth embodiment; and FIG. 27 is a sectional view for a stacked gate type of the MOSFET described in the sixth embodiment.

In the MOSFETs constructed as shown in FIGS. 22 through 27, a reduction in the driving capability can be suppressed by making sidewalls 88 of an insulator whose permittivity is higher than that of the first gate insulating film 80.

Referring to FIGS. 28 through 33, a MOSFET according to a ninth embodiment of the present invention will be explained.

Figure 28:
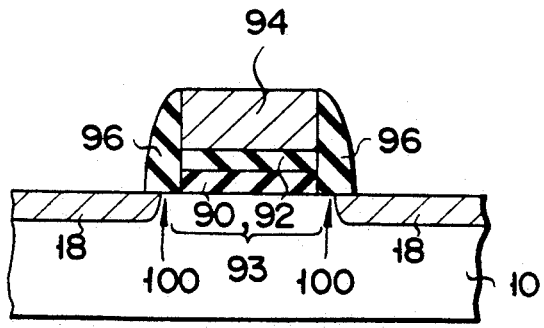
FIG. 28 is a sectional view for a MOSFET according to a ninth embodiment of the present invention.

FIG. 28 is a sectional view for a MOSFET according to the ninth embodiment.

As shown in FIG. 28, the MOSFET of the ninth embodiment is an application of the present invention to MNOSFETs used for non-volatile memory cell transistors. Specifically, on the substrate 10 between the source/drain diffused layers 18, a silicon oxide film 90 is formed, on which a silicon nitride film 92 is formed. These stacked films constitute a gate insulating film 93, on which a gate electrode 94 is formed. Sidewalls 96, composed of an insulator whose permittivity is higher than that of the gate insulating film 93, are formed on and along the sides of the gate electrode 94 and gate insulating film 93, until the substrate 10 is reached. The insulating film constituting the sidewalls 96 may be a tantalum oxide film.

FIGS. 29 through 33 are sectional views for other MOSFETs of the ninth embodiment.

Figure 29:
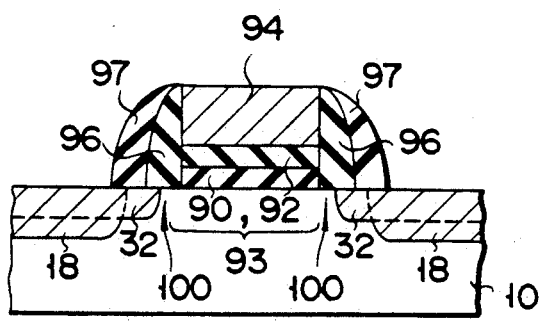

FIG. 29 is a sectional view for an MNOSFET corresponding to the MOSFET described in the second embodiment.

Figure 31:
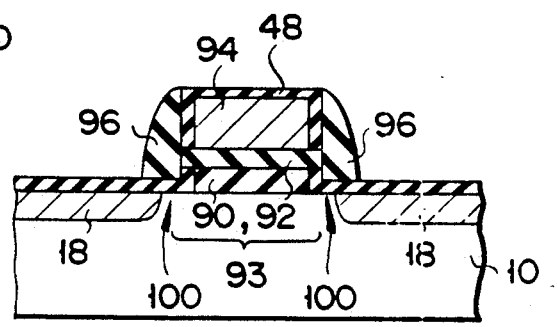
FIGS. 29 through 33 are sectional views for other MOSFETs according to the ninth embodiment.
Figure 32:
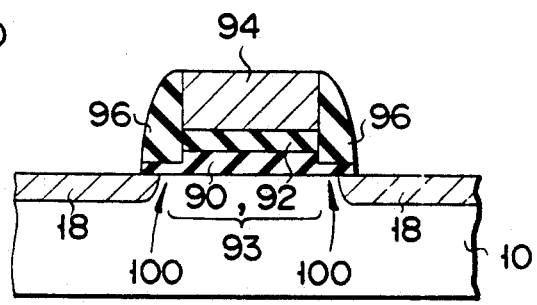
Figure 30:
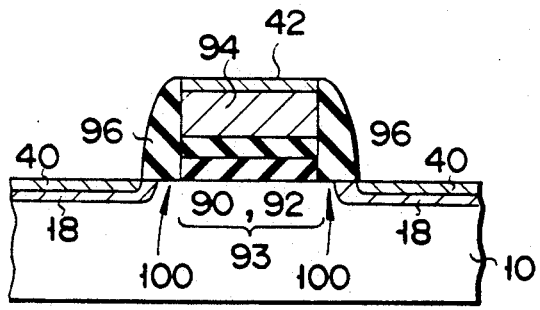
Figure 33:
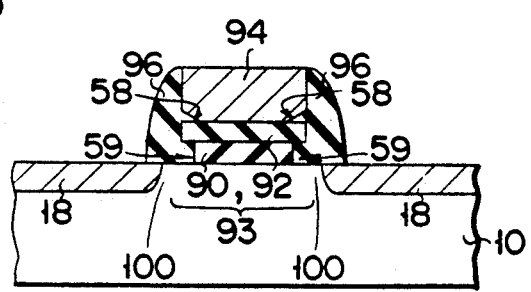

Similarly, FIG. 30 is a sectional view for an MNOSFET corresponding to the MOSFET described in the third embodiment; FIG. 31 is a sectional view for a MNOSFET corresponding to the MOSFET described in the fourth embodiment; FIG. 32 is a sectional view for a MNOSFET corresponding to the MOSFET described in the fifth embodiment; and FIG. 33 is a sectional view for a MNOSFET corresponding to the MOSFET described in the sixth embodiment.

In the MOSFETs constructed as shown in FIGS. 28 through 33, a decrease in the driving capability can be suppressed by making the sidewalls 96 of an insulating film whose permittivity is higher than that of the stacked gate insulating film 93.

In the first through ninth embodiments, those devices have been explained where the gate insulating film is composed of a silicon oxide film and the sidewalls are made up of silicon nitride films. In this invention, however, other insulating films may be used as long as the sidewalls are composed of an insulator whose permittivity is higher than that of the gate insulating film. For example, in the case of the gate insulating film composed of an silicon oxide film, the sidewalls may be made up of a high dielectric material such as a tantalum oxide film, hafnium oxide film, or yttrium oxide film, or a composite film of these films, or a combination of an oxide film and such a composite film. A PZT film, whose permittivity is very high, may also be used for the sidewalls.

While in the silicifying techniques described in the third embodiment, tungsten is used as additive metal for silicification, other metals such as molybdenum may be used. It is desirable to use a high-melting-point metal for the additive metal.

Although in the embodiments, above the current path, two offset regions 100 are formed so as to correspond to the source/drain diffused layers 18, only one offset region may be formed so as to correspond to at least one of the source/drain regions 18. In this case, on the single offset gate region 100, an insulating film whose permittivity is higher than that of the gate insulating film 12 so that a higher electric field may be applied to a portion just under the gate electrode 14.

This invention may be practiced or embodied in still other ways without departing from the spirit of essential character thereof.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type having a main surface;
   a first and second diffused layers of a second conductivity type which are formed at the main surface of said substrate and which have a first impurity concentration;
   a gate insulating film which is composed of a first insulator with a first permittivity and formed on the substrate between said first and second diffused layers so as to be isolated from the first and second diffused layers;
   a gate electrode formed on said gate insulating film;
   first sidewalls which are formed on the sides of said gate insulating film and said gate electrode, extending upward from said substrate and which are composed of a second insulator with a second permittivity higher than the first permittivity of said first insulator;
   second sidewalls which are formed on the sides of said first sidewalls, extending upward from said substrate and which are composed of said second insulator; and
   a third and fourth diffused layers of the second conductivity type which are formed in said first and second diffused layers and which have a second impurity concentration higher than said first impurity concentration, with the interface with said first and second diffused layers being placed below said second sidewalls.

2. The semiconductor device according to claim 1, further comprising:
   a diffused layer of the second conductivity type formed in the substrate between said first and second diffused layers.

3. The semiconductor device according to claim 2, wherein said gate insulating film is composed of a silicon oxide film and said first sidewalls are composed of any one of a silicon nitride film, tantalum oxide film, hafnium oxide film, yttrium oxide film, and PZT film.

4. The semiconductor device according to claim 1, wherein said first insulator is composed of a stacked insulating film consisting of multiple types of insulating materials.

5. The semiconductor device according to claim 4, wherein said stacked insulating film is composed of a silicon oxide film and a silicon nitride film stacked in that order on said substrate, and said first sidewalls are composed of any one of a silicon nitride film, tantalum oxide film, hafnium oxide film, yttrium oxide film, and PZT film.

6. The semiconductor device according to claim 1, wherein said gate insulating film is composed of a silicon oxide film and said first sidewalls are composed of any one of a silicon nitride film, tantalum oxide film, hafnium oxide film, yttrium oxide film, and PZT film.

7. The semiconductor device according to claim 1, further comprising:
   a silicide layer formed in said first and second diffused layers.

8. The semiconductor device according to claim 7, wherein said first gate insulating film is composed of a silicon oxide film and said sidewalls are composed of any one of a silicon nitride film, tantalum oxide film, hafnium oxide film, yttrium oxide film, and PZT film.

9. A semiconductor device comprising:
   a semiconductor substrate of a first conductivity type having a main surface;
   first and second diffused layers of a second conductivity type formed at the main surface of said substrate;
   a gate insulating film which is composed of a first insulator with a first permittivity and formed on the substrate between said first and second diffused layers so as to be isolated from the first and second diffused layers;
   a gate electrode formed on said gate insulating film;
   sidewalls which are formed on and along the sides of said gate insulating film and said gate electrode, extending upward from said substrate, and which are composed of a second insulator with a second permittivity higher than the first permittivity of said first insulator;
   offset regions within said substrate under said sidewalls, and indicating the same conductivity type as the substrate when no voltage difference exists between said gate electrode and said substrate and a conductivity opposite to that of said substrate when a voltage difference exists between the gate electrode and the substrate; and
   silicide layers formed in said first and second diffused layers.

10. The semiconductor device according to claim 9, further comprising:
    a diffused layer of the second conductivity type formed in the substrate between said first and second diffused layers.

11. The semiconductor device according to claim 10, wherein said gate insulating film is composed of a silicon oxide film and said sidewalls are composed of any one of a silicon nitride film, tantalum oxide film, hafnium oxide film, yttrium oxide film, and PZT film.

12. The semiconductor device according to claim 9, wherein said first insulator is composed of a stacked insulating film consisting of multiple types of insulating materials.

13. The semiconductor device according to claim 12, wherein said stacked insulating film is composed of a silicon oxide film and a silicon nitride film stacked in that order on said substrate, and said sidewalls are composed of any one of a silicon nitride film, tantalum oxide film, hafnium oxide film, yttrium oxide film, and PZT film.

14. The semiconductor device according to claim 9, wherein said gate insulating film is composed of a silicon oxide film and said sidewalls are composed of any one of a silicon nitride film, tantalum oxide film, hafnium oxide film, yttrium oxide film, and PZT film.

15. A semiconductor device comprising:
a semiconductor substrate of a first conductivity type having a main surface;
a first and second diffused layers of a second conductivity type formed at the main surface of said substrate;
a gate insulating film of a first film equivalent oxide thickness, which is composed of a first insulator with a first permittivity and formed on the substrate between said first and second diffused layers so as to be isolated from these first and second diffused layers;
a gate electrode formed on said gate insulating film;
an insulating film which is formed on the sides of said gate insulating film and said gate electrode, extending upward from said substrate, and which has a second film equivalent oxide thickness thinner than the first film equivalent oxide thickness of said gate insulating film; and
sidewalls which are formed on said insulating film and which are composed of a second insulator with a second permittivity higher than the first permittivity of said first insulator.

16. The semiconductor device according to claim 15, further comprising:
a diffused layer of the second conductivity type formed in the substrate between said first and second diffused layers.

17. The semiconductor device according to claim 16, wherein said gate insulating film is composed of a silicon oxide film and said sidewalls are composed of any one of a silicon nitride film, tantalum oxide film, hafnium oxide film, yttrium oxide film, and PZT film.

18. The semiconductor device according to claim 15 wherein said first insulator is composed of a stacked insulating film consisting of multiple types of insulating materials.

19. The semiconductor device according to claim 18, wherein said stacked insulating film is composed of a silicon oxide film and a silicon nitride film stacked in that order on said substrate, and said sidewalls are composed of any one of a silicon nitride film, tantalum oxide film, hafnium oxide film, yttrium oxide film, and PZT film.

20. The semiconductor device according to claim 15, wherein said gate insulating film is composed of a silicon oxide film and said sidewalls are composed of any one of a silicon nitride film, tantalum oxide film, hafnium oxide film, yttrium oxide film, and PZT film.

21. A semiconductor device comprising:

a semiconductor substrate of a first conductivity type having a main surface;
a first and second diffused layers of a second conductivity type formed at the main surface of said substrate;
a gate insulating film of a first film thickness, which is composed of a first insulator with a first permittivity and formed on the substrate between said first and second diffused layers so as to be isolated from these first and second diffused layers;
an insulating film which is composed of the first insulator the same as said gate insulating film and formed on the sides of said gate insulating film, extending upward from said substrate, and which has a second film thickness thinner than the first film thickness of said gate insulating film;
a gate electrode formed on said gate insulating film; and
sidewalls which are formed on the sides of said gate insulating film and said gate electrode above said insulating film, extending upward from said substrate, and which are composed of a second insulator with a second permittivity higher than the first permittivity of said first insulator.

22. The semiconductor device according to claim 21, further comprising:
a diffused layer of the second conductivity type formed in the substrate between said first and second diffused layers.

23. The semiconductor device according to claim 22, wherein said gate insulating film is composed of a silicon oxide film and said sidewalls are composed of any one of a silicon nitride film, tantalum oxide film, hafnium oxide film, yttrium oxide film, and PZT film.

24. The semiconductor device according to claim 21, wherein said first insulator is composed of a stacked insulating film consisting of multiple types of insulating materials.

25. The semiconductor device according to claim 24, wherein said stacked insulating film is composed of a silicon oxide film and a silicon nitride film stacked in that order on said substrate, and said sidewalls are composed of any one of a silicon nitride film, tantalum oxide film, hafnium oxide film, yttrium oxide film, and PZT film.

26. The semiconductor device according to claim 21, wherein said gate insulating film is composed of a silicon oxide film and said sidewalls are composed of any one of a silicon nitride film, tantalum oxide film, hafnium oxide film, yttrium oxide film, and PZT film.

27. A semiconductor device comprising:
a semiconductor substrate of a first conductivity type having a main surface;
a first and second diffused layers of a second conductivity type formed at the main surface of said substrate;
a gate insulating film which is composed of a first insulator with a first permittivity and formed on the substrate between said first and second diffused layers so as to be isolated from the first and second diffused layers;
a gate electrode formed on said gate insulating film so as to partly extend beyond the gate insulating film; and
sidewalls which are formed on the sides of said gate electrode, extending upward from said substrate, so as to fill up a clearance between said gate electrode and substrate caused by said gate electrode extending beyond said gate insulating film and which are composed of a second insulator with a second permittivity higher than the first permittivity of said first insulator.

28. The semiconductor device according to claim 27, further comprising:
a diffused layer of the second conductivity type formed in the substrate between said first and second diffused layers.

29. The semiconductor device according to claim 28, wherein said gate insulating film is composed of a silicon oxide film and said sidewalls are composed of any one of a silicon nitride film, tantalum oxide film, hafnium oxide film, yttrium oxide film, and PZT film.

30. The semiconductor device according to claim 27, wherein said first insulator is composed of a stacked insulating film consisting of multiple types of insulating materials.

31. The semiconductor device according to claim 30, wherein said stacked insulating film is composed of a silicon oxide film and a silicon nitride film stacked in that order on said substrate, and said sidewalls are composed of any one of a silicon nitride film, tantalum oxide film, hafnium oxide film, yttrium oxide film, and PZT film.

32. The semiconductor device according to claim 27, wherein said gate insulating film is composed of a silicon oxide film and said sidewalls are composed of any one of a silicon nitride film, tantalum oxide film, hafnium oxide film, yttrium oxide film, and PZT film.

33. A semiconductor device comprising:
a semiconductor substrate of a first conductivity type having a main surface;
a first and second diffused layers of a second conductivity type formed at the main surface of said substrate;
a first gate insulating film which is composed of a first insulator with a first permittivity and formed on the substrate between said first and second diffused layers so as to be isolated from the first and second diffused layers;
a floating gate electrode formed on said first gate insulating film;
a second gate insulating film formed on said floating gate electrode;
a control gate electrode formed said second gate insulating film; and
sidewalls which are formed on and along the sides of said first gate insulating film, floating gate electrode, second gate insulating film, and control gate electrode in that order, extending upward from said substrate, and which are composed of a second insulator with a second permittivity higher than the first permittivity of said first insulator.

34. The semiconductor device according to claim 33, wherein said first gate insulating film is composed of a silicon oxide film and said sidewalls are composed of any one of a silicon nitride film, tantalum oxide film, hafnium oxide film, yttrium oxide film, and PZT film.

35. A semiconductor device comprising:
a semiconductor substrate of a first conductivity type having a main surface;
a first and second diffused layers of a second conductivity type which is formed at the main surface of said substrate and which have a first impurity concentration;
a first gate insulating film which is composed of a first insulator with a first permittivity and formed on the substrate between said first and second diffused layers so as to be isolated from the first and second diffused layers;
a floating gate electrode formed on said first gate insulating film;
a second gate insulating film formed on said floating gate electrode;
a control gate electrode formed on said second gate insulating film;
first sidewalls which are formed on and along the sides of said first gate insulating film, floating gate electrode, second gate insulating film, and control gate electrode in that order, extending upward from said substrate, and which are composed of a second insulator with a second permittivity higher than the first permittivity of said first insulator;
second sidewalls which are composed of said second insulator and formed on the sides of said first sidewalls, extending upward from said substrate; and
a third and fourth diffused layers of a second conductivity type which are formed in said first and second diffused layers and which have a second impurity concentration higher than said first impurity concentration, with the interface with said and second diffused layers being placed below said first second sidewalls.

36. The semiconductor device according to claim 35, wherein said first gate insulating film is composed of a silicon oxide film and said first sidewalls are composed of any one of a silicon nitride film, tantalum oxide film, hafnium oxide film, yttrium oxide film, and PZT film.

37. The semiconductor device comprising:
a semiconductor substrate of a first conductivity type having a main surface;
a first and second diffused layers of a second conductivity type which is formed at the main surface of said substrate;
a first gate insulating film of a first film equivalent oxide thickness which is composed of a first insulator with a first permittivity and formed on the substrate between said first and second diffused layers so as to be isolated from the first and second diffused layers;
a floating gate electrode formed on said first gate insulating film;
a second gate insulating film formed on said floating gate electrode;
a control gate electrode formed on said second gate insulating film;
insulating films which are formed on and along the sides of said first gate insulating film, floating gate electrode, second gate insulating film, and control gate electrode in that order, extending upward from said substrate, and which have a second film equivalent oxide thickness thinner than the first film equivalent oxide thickness of said first gate insulating film; and
sidewalls which are formed on the sides of said first insulating films and which are composed of a second insulator with a second permittivity higher than the first permittivity of said first insulator.

38. The semiconductor device according to claim 37, wherein said first gate insulating film is composed of a silicon oxide film and said sidewalls are composed of any one of a silicon nitride film, tantalum oxide film, hafnium oxide film, yttrium oxide film, and PZT film.

39. A semiconductor device comprising:

a semiconductor substrate of a first conductivity type having a main surface;

a first and second diffused layers of a second conductivity type which is formed at the main surface of said substrate;

a first gate insulating film of a first film thickness which is composed of a first insulator with a first permittivity and formed on the substrate between said first and second diffused layers so as to be isolated from these first and second diffused layers;

insulating films which are composed of the first insulator the same as said first gate insulating film and formed on the sides of said first gate insulating film, extending upward from said substrate, and which have a second film thickness thinner than the first film thickness of said first gate insulating film;

a floating gate electrode formed on said first gate insulating film;

a second gate insulating film formed on said floating gate electrode;

a control gate electrode formed on said second gate insulating film; and sidewalls which are formed on and along the sides of said first gate insulating film, floating gate electrode, second gate insulating film, and control gate electrode in that order, extending upward from said substrate, and which are composed of a second insulator with a second permittivity higher than the first permittivity of said first insulator.

40. The semiconductor device according to claim 39, wherein said first gate insulating film is composed of a silicon oxide film and said sidewalls are composed of any one of a silicon nitride film, tantalum oxide film, hafnium oxide film, yttrium oxide film, and PZT film.

41. A semiconductor device comprising:

a semiconductor substrate of a first conductivity type having a main surface;

a first and second diffused layers of a second conductivity type formed at the main surface of said substrate;

a first gate insulating film which is composed of a first insulator with a first permittivity and formed on the substrate between said first and second diffused layers so as to be isolated from the first and second diffused layers;

a floating gate electrode formed on said first gate insulating film so as to partly extend beyond the insulating film;

a second gate insulating film formed on said floating gate electrode;

a control gate electrode formed on said second gate insulating film; and sidewalls which are formed on and along the sides of said floating gate electrode, second gate insulating film, and control gate electrode in that order, extending upward from said substrate, so as to fill up a clearance between said gate electrode and substrate caused by said gate electrode extending beyond said gate insulating film and which are composed of a second insulator with a second permittivity higher than the first permittivity of said first insulator.

42. The semiconductor device according to claim 41, wherein said first gate insulating film is composed of a silicon oxide film and said sidewalls are composed of any one of a silicon nitride film, tantalum oxide film, hafnium oxide film, yttrium oxide film, and PZT film.

43. A semiconductor device comprising:

a semiconductor substrate of a first conductivity type having a main surface;

a first and second diffused layers of a second conductivity type formed at the main surface of said substrate;

a first gate insulating film which is composed of a first insulator with a first permittivity and formed on the substrate between said first and second diffused layers so as to be isolated from the first and second diffused layers;

a first gate electrode formed on said first gate insulating film;

first sidewalls which are formed on the sides of said first gate insulating film and first gate electrode, extending upward from said substrate, and which are composed of a second insulator with a second permittivity higher than the first permittivity of said first insulator;

a third and fourth diffused layers of the second conductivity formed at the main surface of said substrate;

a second gate insulating film formed on the substrate between said third and fourth diffused layers so as to overlap with these third and fourth diffused layers;

a second gate electrode formed on said second gate insulating film; and second sidewalls formed on the sides of said second gate insulating film and second gate electrode, extending upward from said substrate.

44. The semiconductor device according to claim 43, wherein said first gate insulating film is composed of a silicon oxide film and said sidewalls are composed of any one of a silicon nitride film, tantalum oxide film, hafnium oxide film, yttrium oxide film, and PZT film.

* * * * *